(12) United States Patent
Rylov

(10) Patent No.: US 7,961,025 B2
(45) Date of Patent: Jun. 14, 2011

(54) CURRENT-MODE PHASE ROTATOR WITH PARTIAL PHASE SWITCHING

(75) Inventor: Sergey Vladimirovich Rylov, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 12/535,112

(22) Filed: Aug. 4, 2009

(65) Prior Publication Data

US 2010/0109734 A1    May 6, 2010

Related U.S. Application Data

(63) Continuation-in-part of application No. 12/024,043, filed on Jan. 31, 2008, now abandoned.

(51) Int. Cl.
*H03H 11/16* (2006.01)
*H03K 5/13* (2006.01)
(52) U.S. Cl. ......... 327/231; 327/237; 327/238; 327/256
(58) Field of Classification Search .................. 327/231, 327/237, 238, 256
See application file for complete search history.

(56) References Cited

U.S. PATENT DOCUMENTS

| | | | |
|---|---|---|---|
| 6,535,562 B1 | 3/2003 | Mohseni et al. | |
| 6,806,763 B2 | 10/2004 | Kim et al. | |
| 6,819,276 B1 | 11/2004 | Hossack | |
| 7,010,280 B1 | 3/2006 | Wilson | |
| 7,162,002 B2 | 1/2007 | Chen et al. | |
| 7,560,967 B2 * | 7/2009 | Freyman et al. | 327/231 |
| 2003/0185327 A1 | 10/2003 | Chen | |
| 2005/0225464 A1 | 10/2005 | Lin et al. | |
| 2006/0285583 A1 | 12/2006 | Baumgartner et al. | |
| 2008/0048904 A1 | 2/2008 | Lee et al. | |

OTHER PUBLICATIONS

Bulzacchelli et al., "A 10-Gb/s 5-Tap DFE/4-Tap FFE Transceiver in 90-nm CMOS Technology", IEEE Journal of Solid-State Circuits, vol. 41, No. 12, Dec. 2006, pp. 2885-2900.
Sidiropoulos et al., "A Semi-Digital DLL with Unlimited Phase Shift Capability and 0.08-400 MHz Operating Range", 1997 IEEE International Solid-State Circuits Conference, Digest of Technical Papers, pp. 332,333 and 481.

* cited by examiner

*Primary Examiner* — Lincoln Donovan
*Assistant Examiner* — John W Poos
(74) *Attorney, Agent, or Firm* — Yee & Associates, P.C.; Diana R. Gerhardt

(57) ABSTRACT

In one illustrative embodiment, an apparatus for a current-mode phase rotator with partial input phase switching comprises a mixer, wherein the mixer is a four quadrant current-mode mixer comprised of four interpolation buffers, wherein each interpolation buffer receives as input a clock phase from a set of four equidistant clock phases, and a set of two-output current-steering digital to analog converters that supply tail currents to the mixer wherein a first digital to analog converter has additional switches to connect each of two outputs to one of two polarities of a given clock while each remaining digital to analog converter has no additional switches and has two outputs supplying current only to two different polarities of a same clock phase wherein steering the current during incremental rotation about a phase circle defines an octagonal shaped phase envelope.

28 Claims, 7 Drawing Sheets

| STATE | MIXER WEIGHTS | IQ-DAC | I-DAC | Q-DAC |
|---|---|---|---|---|
| 0 | +12.5I+0.5(-Q) | +9.5I+0.5(-Q) | (3.0-0.0)I | (1.5-1.5)(-Q) |
| 1 | +12.5I+1.5(-Q) | +9.5I+0.5(-Q) | (3.0-0.0)I | (2.0-1.0)(-Q) |
| 2 | +12.5I+2.5(-Q) | +9.5I+0.5(-Q) | (3.0-0.0)I | (2.5-0.5)(-Q) |
| 3 | +12.5I+3.5(-Q) | +9.5I+0.5(-Q) | (3.0-0.0)I | (3.0-0.0)(-Q) |
| 4 | +11.5I+4.5(-Q) | +8.5I+1.5(-Q) | (3.0-0.0)I | (3.0-0.0)(-Q) |
| 5 | +10.5I+5.5(-Q) | +7.5I+2.5(-Q) | (3.0-0.0)I | (3.0-0.0)(-Q) |
| 6 | +9.5I+6.5(-Q) | +6.5I+3.5(-Q) | (3.0-0.0)I | (3.0-0.0)(-Q) |
| 7 | +8.5I+7.5(-Q) | +5.5I+4.5(-Q) | (3.0-0.0)I | (3.0-0.0)(-Q) |
| 8 | +7.5I+8.5(-Q) | +4.5I+5.5(-Q) | (3.0-0.0)I | (3.0-0.0)(-Q) |
| 9 | +6.5I+9.5(-Q) | +3.5I+6.5(-Q) | (3.0-0.0)I | (3.0-0.0)(-Q) |
| 10 | +5.5I+10.5(-Q) | +2.5I+7.5(-Q) | (3.0-0.0)I | (3.0-0.0)(-Q) |
| 11 | +4.5I+11.5(-Q) | +1.5I+8.5(-Q) | (3.0-0.0)I | (3.0-0.0)(-Q) |
| 12 | +3.5I+12.5(-Q) | +0.5I+9.5(-Q) | (3.0-0.0)I | (3.0-0.0)(-Q) |
| 13 | +2.5I+12.5(-Q) | +0.5I+9.5(-Q) | (2.5-0.5)I | (3.0-0.0)(-Q) |
| 14 | -1.5I+12.5(-Q) | +0.5I+9.5(-Q) | (2.0-1.0)I | (3.0-0.0)(-Q) |
| 15 | +0.5I+12.5(-Q) | +0.5I+9.5(-Q) | (1.5-1.5)I | (3.0-0.0)(-Q) |
| 16 | -0.5I+12.5(-Q) | -0.5I+9.5(-Q) | (1.5-1.5)I | (3.0-0.0)(-Q) |
| 17 | -1.5I+12.5(-Q) | -0.5I+9.5(-Q) | (1.0-2.0)I | (3.0-0.0)(-Q) |
| 18 | -2.5I+12.5(-Q) | -0.5I+9.5(-Q) | (0.5-2.5)I | (3.0-0.0)(-Q) |
| 19 | -3.5I+12.5(-Q) | -0.5I+9.5(-Q) | (0.0-3.0)I | (3.0-0.0)(-Q) |
| 20 | -4.5I+11.5(-Q) | -1.5I+8.5(-Q) | (0.0-3.0)I | (3.0-0.0)(-Q) |
| 21 | -5.5I+10.5(-Q) | -2.5I+7.5(-Q) | (0.0-3.0)I | (3.0-0.0)(-Q) |
| 22 | -6.5I+9.5(-Q) | -3.5I+6.5(-Q) | (0.0-3.0)I | (3.0-0.0)(-Q) |
| 23 | -7.5I+8.5(-Q) | -4.5I+5.5(-Q) | (0.0-3.0)I | (3.0-0.0)(-Q) |
| 24 | -8.5I+7.5(-Q) | -5.5I+4.5(-Q) | (0.0-3.0)I | (3.0-0.0)(-Q) |
| 25 | -9.5I+6.5(-Q) | -6.5I+3.5(-Q) | (0.0-3.0)I | (3.0-0.0)(-Q) |
| 26 | -10.5I+5.5(-Q) | -7.5I+2.5(-Q) | (0.0-3.0)I | (3.0-0.0)(-Q) |
| 27 | -11.5I+4.5(-Q) | -8.5I+1.5(-Q) | (0.0-3.0)I | (3.0-0.0)(-Q) |
| 28 | -12.5I+3.5(-Q) | -9.5I+0.5(-Q) | (0.0-3.0)I | (3.0-0.0)(-Q) |
| 29 | -12.5I+2.5(-Q) | -9.5I+0.5(-Q) | (0.0-3.0)I | (2.5-0.5)(-Q) |
| 30 | -12.5I+1.5(-Q) | -9.5I+0.5(-Q) | (0.0-3.0)I | (2.0-1.0)(-Q) |
| 31 | -12.5I+0.5(-Q) | -9.5I+0.5(-Q) | (0.0-3.0)I | (1.5-1.5)(-Q) |

*FIG. 7A*

| | | | | | |
|---|---|---|---|---|---|
| 32 | -12.5I-0.5(-Q) | -9.5I-0.5(-Q) | (0.0-3.0)I | (1.5-1.5)(-Q) |
| 33 | -12.5I-1.5(-Q) | -9.5I-0.5(-Q) | (0.0-3.0)I | (1.0-2.0)(-Q) |
| 34 | -12.5I-2.5(-Q) | -9.5I-0.5(-Q) | (0.0-3.0)I | (0.5-2.5)(-Q) |
| 35 | -12.5I-3.5(-Q) | -9.5I-0.5(-Q) | (0.0-3.0)I | (0.0-3.0)(-Q) |
| 36 | -11.5I-4.5(-Q) | -8.5I-1.5(-Q) | (0.0-3.0)I | (0.0-3.0)(-Q) |
| 37 | -10.5I-5.5(-Q) | -7.5I-2.5(-Q) | (0.0-3.0)I | (0.0-3.0)(-Q) |
| 38 | -9.5I-6.5(-Q) | -6.5I-3.5(-Q) | (0.0-3.0)I | (0.0-3.0)(-Q) |
| 39 | -8.5I-7.5(-Q) | -5.5I-4.5(-Q) | (0.0-3.0)I | (0.0-3.0)(-Q) |
| 40 | -7.5I-8.5(-Q) | -4.5I-5.5(-Q) | (0.0-3.0)I | (0.0-3.0)(-Q) |
| 41 | -6.5I-9.5(-Q) | -3.5I-6.5(-Q) | (0.0-3.0)I | (0.0-3.0)(-Q) |
| 42 | -5.5I-10.5(-Q) | -2.5I-7.5(-Q) | (0.0-3.0)I | (0.0-3.0)(-Q) |
| 43 | -4.5I-11.5(-Q) | -1.5I-8.5(-Q) | (0.0-3.0)I | (0.0-3.0)(-Q) |
| 44 | -3.5I-12.5(-Q) | -0.5I-9.5(-Q) | (0.0-3.0)I | (0.0-3.0)(-Q) |
| 45 | -2.5I-12.5(-Q) | -0.5I-9.5(-Q) | (0.5-2.5)I | (0.0-3.0)(-Q) |
| 46 | -1.5I-12.5(-Q) | -0.5I-9.5(-Q) | (1.0-2.0)I | (0.0-3.0)(-Q) |
| 47 | -0.5I-12.5(-Q) | -0.5I-9.5(-Q) | (1.5-1.5)I | (0.0-3.0)(-Q) |
| 48 | +0.5I-12.5(-Q) | +0.5I-9.5(-Q) | (1.5-1.5)I | (0.0-3.0)(-Q) |
| 49 | +1.5I-12.5(-Q) | +0.5I-9.5(-Q) | (2.0-1.0)I | (0.0-3.0)(-Q) |
| 50 | +2.5I-12.5(-Q) | +0.5I-9.5(-Q) | (2.5-0.5)I | (0.0-3.0)(-Q) |
| 51 | +3.5I-12.5(-Q) | +0.5I-9.5(-Q) | (3.0-0.0)I | (0.0-3.0)(-Q) |
| 52 | +4.5I-11.5(-Q) | +1.5I-8.5(-Q) | (3.0-0.0)I | (0.0-3.0)(-Q) |
| 53 | +5.5I-10.5(-Q) | +2.5I-7.5(-Q) | (3.0-0.0)I | (0.0-3.0)(-Q) |
| 54 | +6.5I-9.5(-Q) | +3.5I-6.5(-Q) | (3.0-0.0)I | (0.0-3.0)(-Q) |
| 55 | +7.5I-8.5(-Q) | +4.5I-5.5(-Q) | (3.0-0.0)I | (0.0-3.0)(-Q) |
| 56 | +8.5I-7.5(-Q) | +5.5I-4.5(-Q) | (3.0-0.0)I | (0.0-3.0)(-Q) |
| 57 | +9.5I-6.5(-Q) | +6.5I-3.5(-Q) | (3.0-0.0)I | (0.0-3.0)(-Q) |
| 58 | +10.5I-5.5(-Q) | +7.5I-2.5(-Q) | (3.0-0.0)I | (0.0-3.0)(-Q) |
| 59 | +11.5I-4.5(-Q) | +8.5I-1.5(-Q) | (3.0-0.0)I | (0.0-3.0)(-Q) |
| 60 | +12.5I-3.5(-Q) | +9.5I-0.5(-Q) | (3.0-0.0)I | (0.0-3.0)(-Q) |
| 61 | +12.5I-2.5(-Q) | +9.5I-0.5(-Q) | (3.0-0.0)I | (0.5-2.5)(-Q) |
| 62 | +12.5I-1.5(-Q) | +9.5I-0.5(-Q) | (3.0-0.0)I | (1.0-2.0)(-Q) |
| 63 | +12.5I-0.5(-Q) | +9.5I-0.5(-Q) | (3.0-0.0)I | (1.5-1.5)(-Q) |

*FIG. 7B*

CURRENT-MODE PHASE ROTATOR WITH PARTIAL PHASE SWITCHING

This application is a continuation-in-part of application Ser. No. 12/024,043, filed Jan. 31, 2008, status pending, which is incorporated by reference herein.

This invention was made with United States Government support under Agreement No. HR0011-07-9-0002 awarded by DARPA. The Government has certain rights in the invention.

BACKGROUND

1. Field

The disclosure relates generally to an improved data processing system for precision control of phases of clock signals, and more specifically, to a high-precision current-mode phase rotator.

2. Description of the Related Art

Phase rotators are critical components of clock subsystems of modern data processing and communications systems. Phase rotators modify, in a highly precise and reproducible fashion, the phase of clock signals within an unlimited phase range and therefore are capable of generating clock signals with programmable phase and frequency offsets. A common architecture used to design high-speed phase rotators is based on current-mode logic (CML) and uses a quadrature clock set of I,Q in which four clock phases at 0, 90, 180, and 270 degrees are labeled as +I, +Q, −I, −Q. An implementation of the architecture derives high speed-and-ease of implementation of highly linear mixers, for example, highly linear analog multipliers, from use of the current-mode logic circuits. Existing phase rotators based on this architecture typically consist of a first part of a four-quadrant differential current-mode mixer receiving as input four high-speed clock phases and driven by four variable currents that encode their respective weights, and a second part containing current-mode digital to analog converter (DAC), also referred to as integrated digital to analog converter (IDAC), that generates the four variable currents. The latter part of the rotator comprising the digital to analog converter typically dominates the circuit area. Therefore, it is usually desirable to minimize the complexity of the digital to analog converter.

In an ideal case, the weighting currents generated by the digital to analog converter would be sinusoidal functions of the desired phase shift $\phi$, and more specifically, the weights applied to differential phases I=(+I,−I) and Q=(+Q,−Q) would be $\cos\phi$ and $\sin\phi$ respectively. However, the complexity of such an ideal digital to analog converter makes implementation impractical and a piece-wise linear approximation of the intended sinusoidal shape of the output signal of such digital to analog converters is used instead.

Two basic types of current-mode logic quadrature phase rotators are in common use, which differ by the digital to analog converter approach used to produce the required four current outputs used. A first type uses a single dual-output digital to analog converter with two polarity switches and a second type uses two such digital to analog converters without switches. The first type is simpler to implement and produces weighting coefficients that approximate the sine wave with a triangular wave. The second type is approximately twice as complex to implement as the first and approximates the sine wave with a trapezoidal wave with equal duration of slewing and flat portions.

The first type of the single-digital to analog converter architecture produces interpolation non-linearity in the vicinity of the polarity-switching points. The second type that uses the dual-digital to analog converter architecture, while generally producing more linear results due to non-switching, typically suffers from reduced power efficiency. Power reduction may be approximately a 3 dB of extra power loss. Use of two converters instead of one requires a larger area due to the increased complexity. In addition, both of these architectures exhibit substantial variability of gain for different rotation phase angles, such as approximately 3 dB.

A better solution for a current-mode quadrature-input phase rotator is required to reduce the nonlinear behavior of a switched single digital to analog converter approach while remaining simpler than the dual-digital to analog converter approach and retaining the high power efficiency of the single-digital to analog converter solution.

SUMMARY

According to one illustrative embodiment, an apparatus for a current-mode phase rotator with partial input phase switching comprises a mixer, wherein the mixer is a four quadrant current-mode mixer comprised of four interpolation buffers, wherein each interpolation buffer receives as input a clock phase from a set of four equidistant clock phases, and a set of current-steering digital to analog converters that supply tail currents to the mixer, wherein a first digital to analog converter has additional switches to connect each of two outputs to one of two polarities of a given clock while each remaining digital to analog converter has no additional switches and has two outputs supplying current only to two different polarities of a same clock phase wherein steering the current during incremental rotation about a phase circle defines an octagonal shaped phase envelope.

According to one illustrative embodiment, an apparatus for a current-mode phase rotator with partial input phase switching comprises a mixer comprising a set of four interpolation buffers sharing a common load wherein each interpolation buffer receives as input a clock phase from a set of equidistant clock phases and a weight signal, a set of digital to analog converters in a composite four-output digital to analog converter each generating two output currents providing the weight signals having a constant sum, wherein at least one digital to analog converter is connected to the set of interpolation buffers through a set of switches providing output to all of the set of interpolation buffers and remaining digital to analog converters are connected directly to the interpolation buffers, wherein each of the remaining digital to analog converters can supply output to only two of the set of interpolation buffers.

According to another illustrative embodiment, a system comprises a system bus, a memory controller/cache connected to the system bus, a local memory, a series communication link between the memory controller/cache and the local memory, a processor connected to the system bus. a mixer, within the series communication link, wherein the mixer is a four quadrant current-mode mixer comprised of four interpolation buffers, wherein each interpolation buffer receives as input a clock phase from a set of four equidistant clock phases, and a set of current-steering digital to analog converters that supply tail currents to the mixer, wherein a first digital to analog converter has additional switches to connect each of two outputs to one of two polarities of a given clock phase, wherein one output would supply current to one of phase 0 or phase 180, while another output would supply current to one of phase 90 or phase 270, while each remaining digital to analog converter has no additional switches and has two outputs supplying current only to two different polarities of a same clock phase, wherein one digital to analog converter steers current only between phases 0 and 180, while another digital to analog converter steers current only between phases 90 and 270, wherein steering current during incremental rotation about a phase circle defines an octagonal shaped phase envelope.

BRIEF DESCRIPTION OF THE SEVERAL VIEWS OF THE DRAWINGS

FIGS. 7A and 7B are tabular representations of values of phase rotator digital to analog converter states, using the example phase rotator of FIG. 5, in accordance with illustrative embodiments.

DETAILED DESCRIPTION

As will be appreciated by one skilled in the art, the present invention may be embodied as a system. Accordingly, the present invention may take the form of an entirely hardware embodiment, or an embodiment combining software and hardware aspects that may all generally be referred to herein as a "circuit," "module" or "system." The present invention is described below with reference to block diagrams of apparatus (systems) according to embodiments of the invention.

Figure 1:
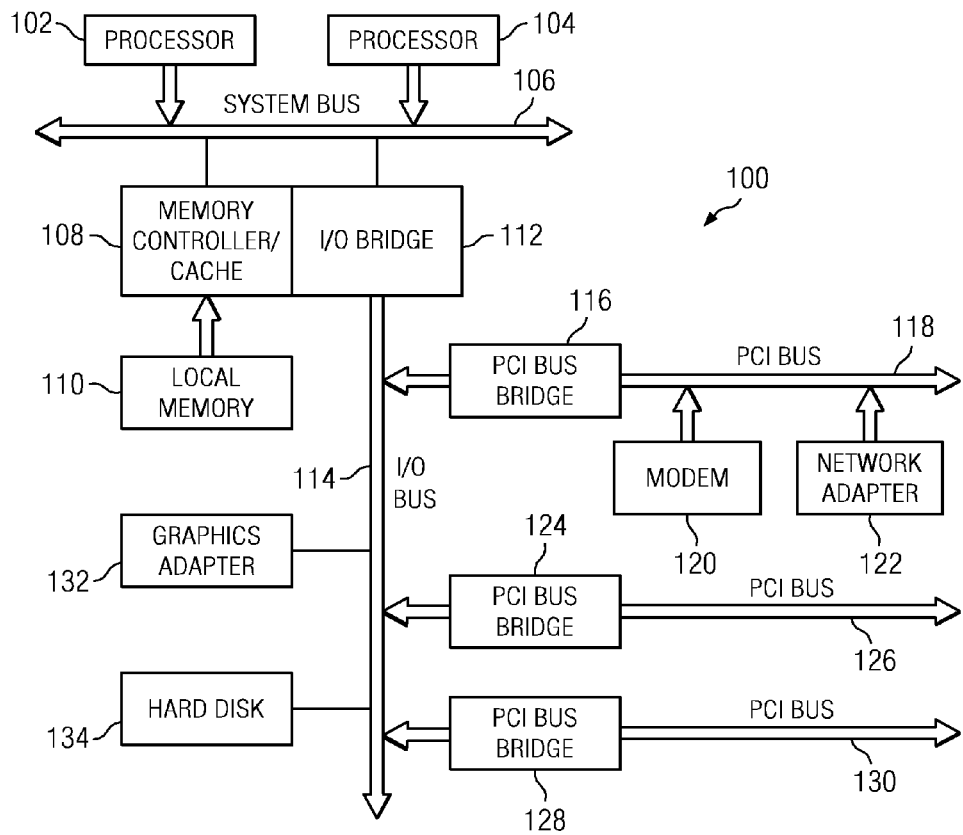
FIG. 1 is a block diagram of a data processing system in accordance with an embodiment.

Referring to FIG. 1, a block diagram of a data processing system is depicted in accordance with a preferred embodiment of the present invention. Data processing system 100 may be a symmetric multiprocessor (SMP) system including plurality of processors 102 and 104 connected to system bus 106. Alternatively, a single processor system may be employed. Also connected to system bus 106 is memory controller/cache 108, which provides an interface to local memory 110. I/O bus bridge 112 is connected to system bus 106 and provides an interface to I/O bus 114. Memory controller/cache 108 and I/O bus bridge 112 may be integrated as depicted.

Peripheral component interconnect (PCI) bus bridge 116 connected to I/O bus 114 provides an interface to PCI local bus 118. A number of modems may be connected to PCI local bus 118. Typical PCI bus implementations will support four PCI expansion slots or add-in connectors. Communications links to other systems may be provided through modem 120 and network adapter 122 connected to PCI local bus 118 through add-in boards.

Additional PCI bus bridges 124 and 128 provide interfaces for additional PCI local buses 126 and 130, from which additional modems or network adapters may be supported. In this manner, data processing system 100 allows connections to multiple network computers. Memory-mapped graphics adapter 132 and hard disk 134 may also be connected to I/O bus 114 as depicted, either directly or indirectly.

Those of ordinary skill in the art will appreciate that the hardware depicted in FIG. 1 may vary. For example, other peripheral devices, such as optical disk drives and the like, also may be used in addition to or in place of the hardware depicted. The depicted example is not meant to imply architectural limitations with respect to the present invention.

Timing components such as clocks may be implemented within the components of data processing system 100. For example, processor 102 and processor 104 may have a serial link between them using a phase rotator, as may memory controller/cache 108 and local memory 110. In an alternative embodiment, one or more clocks may be used to commonly provide timing for the previously described components. Typically, as execution speed increases, the requirement for unique timing components increases resulting in each data processing component having a dedicated timing component. When there are multiple clocks, one clock may be referred to as the system clock or reference clock and provide a reference for other clocks to use when synchronizing time is required. Pairs of clocks may also be used together to provide differential input to timing services.

Illustrative embodiments provide a capability for an apparatus of a current-mode phase rotator with partial input phase switching. The apparatus comprises a mixer comprising a set of four interpolation buffers sharing a common load wherein each interpolation buffer receives as input a clock phase from a set of equidistant clock phases and a set of weight signals, a set of digital to analog converters in a composite four-output digital to analog converter each generating two output currents providing the weight signals having a constant sum, wherein at least one digital to analog converter is connected to the set of interpolation buffers through a set of switches providing output to all of the set of interpolation buffers and remaining digital to analog converters are connected directly to the interpolation buffers, wherein each of the remaining digital to analog converters can supply output to only two of the set of interpolation buffers, and a control code that controls individual switches of the composite four-output digital to analog converter to allow only one bit of the control code to change at one time. Clock input is supplied by a "clock subsystem" typically found in data processing systems or communication systems. The phase of the input clock is modified through the use of digital code applied to a phase rotator component that may be implemented within a high speed link between memory controller/cache 108 and local memory 110. A series communication link is an example of a high speed link between memory controller/cache 108 and local memory 110. The phase rotator produces an output clock signal with well-controlled phases by mixing the incoming clock phases with a set of high-precision interpolator weights that are generated by a set of digital to analog converters.

Figure 2:
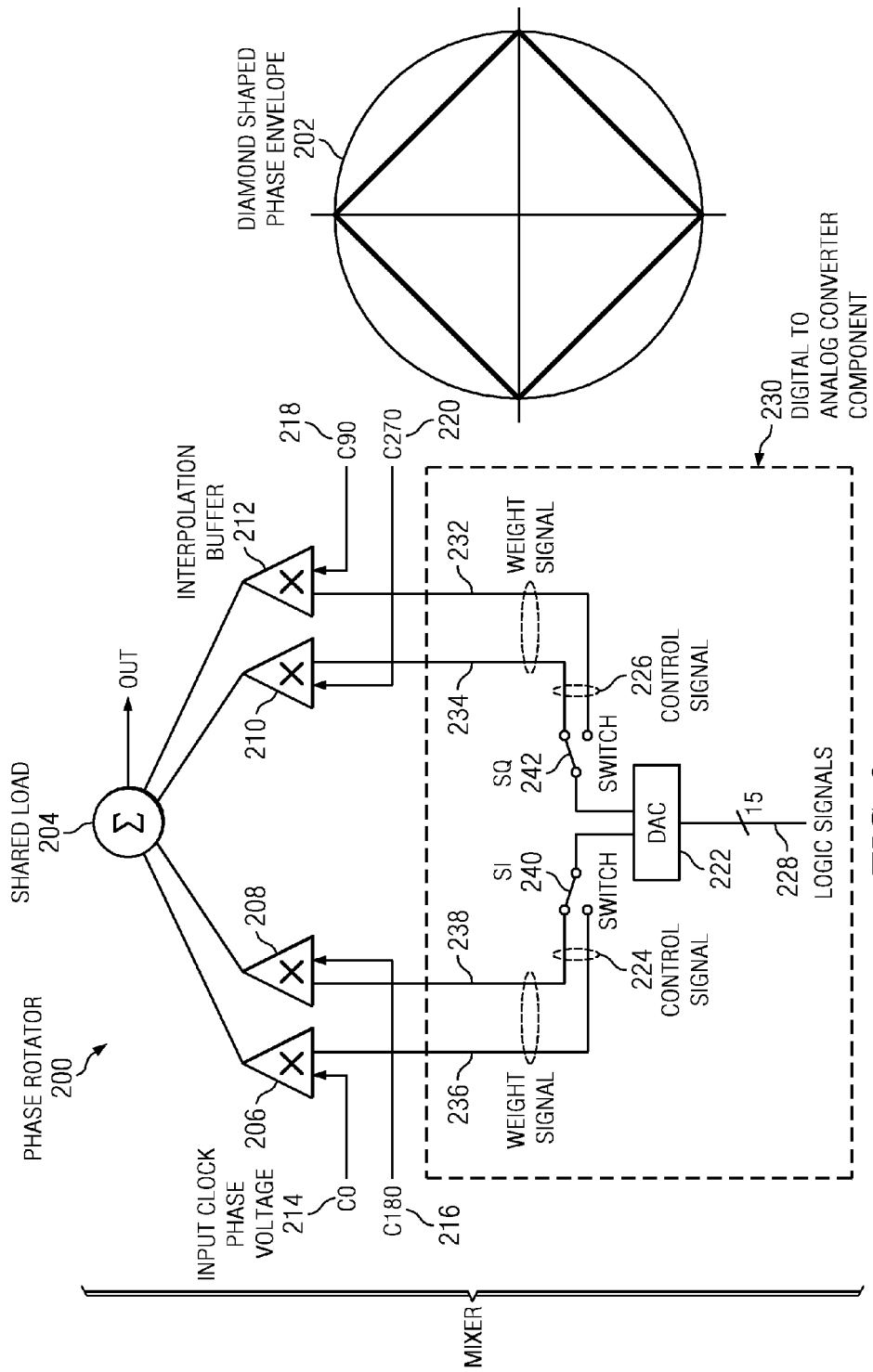
FIG. 2 is a block diagram of a 64-state phase rotator using a single digital to analog converter.

With reference to FIG. 2, a block diagram of a 64-state phase rotator that uses a single digital to analog converter is presented. Phase rotator 200 realizes diamond-shaped phase envelope 202.

In this design, current is steered by the digital to analog converter component 230 between four individual interpolating buffers 206, 208, 210 and 212, with one buffer per input clock phase voltage 214, 216, 218, and 220, which share a common summing load of shared load 204. Digital to analog converter component 230 uses a combination of a single two-output current-steering digital to analog converter (DAC) 222, and two switches 240 and 242 in conjunction with control signals SI 224 and SQ 226 to generate the interpolation weights 232, 234, 236, and 238 for interpolating buffers 206, 208, 210 and 212. Current-steering digital to analog converter 222 produces two variable output currents that have a constant sum. For example, when one of these two currents increases by an amount, the other current simultaneously decreases by the same amount. Only two of the four interpolator input clock phases 214, 216, 218, and 220 are active for any given rotator state while the remaining two phases which are not selected by control signal SI 224 and control signal SQ 226 receive zero weights and thus, do not influence the output phase. Shared load 204 may be implemented as a set of resistors, wherein the set comprises one or more resistors. Current steering cells within digital to analog converter 222 and polarity switches 240, 242 respond to thermometer code input logic signals 228 and polarity signals SI 224 and SQ 226 to produce weight signals 232, 234, 236 and 238. In the illustrated example, digital to analog converter 222 comprises 15 "current steering cells" driven by 15 corresponding control logic signals 228, plus additional "polarity switches" of switch 240 and switch 242. Digital to analog converter component 230 comprises digital to analog converter 222, controlled by logic signals 228, switch 240, switch 242 and their respective control signals SI 224 and SQ 226. Logic signals 228 are typically implemented in a form of control code which may be referred to as thermometer code that allows one to achieve digital to analog converter monotonicity and glitch-free operation. Glitch-free implies that during a transition between states A and B even if the intrinsic delays of different logic signals inside the digital to analog converter are altered substantially, output of the digital to analog converter will still remain between the states A and B. The-digital to analog converter use of thermometer code in the example means that as the digital to analog converter changes states in succession, each bit of the code changes value only once, and only one bit of the code can change at a time.

The current control scheme results in diamond shape envelope 202 for all rotator states as displayed on a I–Q phase diagram, where each state is displayed as a point with coordinates being weights used by the interpolator to generate a linear superposition of orthogonal phases I (at 0 degrees) and Q (at 90 degrees). Negative weights are interpreted as positive ones applied to clock phases of opposite polarity: –I (at 180 degrees) and –Q (at 270 degrees) respectively. The reason for the diamond shape of the phase envelope is that the weights for phases I and Q, of the appropriate polarities, always change simultaneously by the same absolute amount because the current is produced by a single current-steering digital to analog converter. Since the weight taken from phase I is immediately applied to phase Q, such transition appears on an I–Q phase diagram as a diagonal step at 45-degree angle. Since the two weights change simultaneously, continuous stepping of the phase rotator in one direction results in triangular-shaped dependence of these weights on time. For example, each of the weights never stays constant, with a possible exception of polarity switching points.

Diamond shaped phase envelope 202 causes a negative property of this type of phase rotator in the form of amplitude modulation (AM). Amplitude modulation is the dependence of output amplitude on phase position. For example, near rotator phase positions of 0, 90, 180, and 270 degrees the output amplitude is at its maximum (100 percent) since all the available weight is given to only one of the clock phases and all the other clock phases are powered down, resulting in maximum output amplitude and power efficiency. However, near phase positions of 45, 135, 225, and 315 degrees, the output amplitude is reduced by 3 dB. The reduction occurs because interpolation weights at these positions are split equally (50/50) between the two active clock phases that are 90 degrees apart. When added together, the interpolation weights yield amplitude of only $\cos(45)=1/\sqrt{2}$, approximately 70.7 percent of the maximum. Accordingly, the architecture provides a maximum interpolation loss of 3 dB and amplitude modulation of 3 dB, while requiring only one current-steering digital to analog converter using 15 current-steering cells to realize a 64-state phase rotator.

Another drawback of the switched-digital to analog converter rotator architecture is reduced linearity near the polarity-switching points of the quadrant boundaries. The reduced linearity originates from a phenomenon in a single digital to analog converter architecture due to a fact that only two out of four interpolation buffers 206, 208, 210 and 212 can be active at any given time. In this case, in the vicinity of polarity switching points, within the pair of active interpolation buffers one interpolation buffer receives almost the entire available current, while the other interpolation buffer receives almost no current and is therefore under-biased. Since the amount of bias current received by the interpolation buffer modifies the Gm parameters of the interpolation buffer transistors, the reduced bias directly affects both bandwidth and delay of the interpolation buffer. Therefore, the clock phase passing through the under-biased interpolation buffer is likely to experience additional attenuation, due to insufficient bandwidth, as well as additional delay. The latter delay results in an asymmetric linearity distortion because this distortion changes with the position of the polarity switch. For example, if the rotator operates near 0-degree phase position, applying almost the entire weight/current to the phase I (0 degrees) and only a small amount of weight/current to either phase Q (90 degrees) or phase –Q (270 degrees), additional delay will manifest differently depending on the polarity of the latter phase. For example, if phase +Q is active, the additional delay will move that specific phase further apart from phase I (Q lags I), and cause the phase rotator to make larger steps due to increased effective I/Q phase separation. On the other hand, if –Q phase is active, the additional delay will bring it closer to phase I (–Q leads I) and therefore, the phase rotator will make smaller steps in this case.

Figure 3:
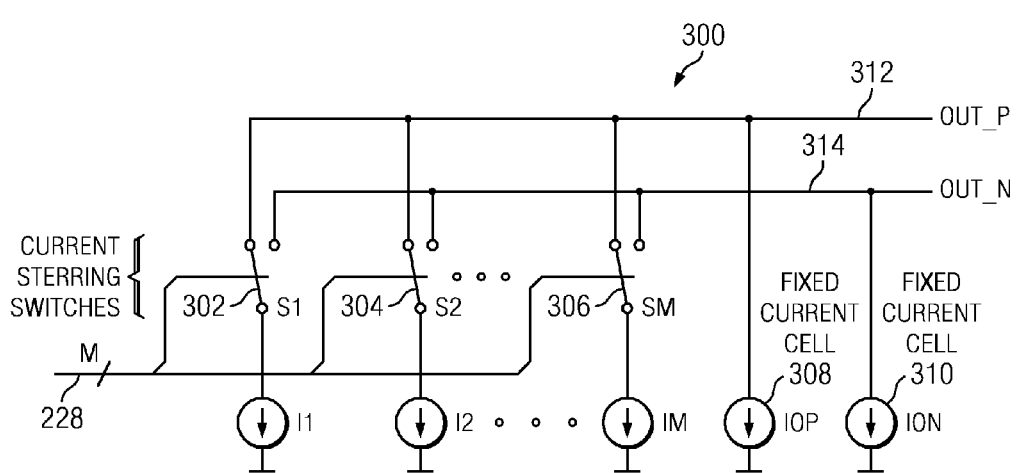
FIG. 3 is a block diagram of a current-steering single digital to analog converter of the phase rotator in FIG. 2.

With reference to FIG. 3, a block diagram of a current-steering single digital to analog converter of the phase rotator of FIG. 2, is presented. FIG. 3 depicts a composition of a current-steering digital to analog converter which appears in digital to analog converter component 230 in FIG. 2 in combination with polarity switches SI 240 and SQ 242 of FIG. 2. Current-steering digital to analog converter 300 consists of a set of constant current sources that are connected to one of the two outputs OUT_P and OUT_N by current-steering switches S1 302, S2 304 through SM 306. Current-steering digital to analog converter 300 is an example of digital to analog converter 222 of FIG. 2 and shows the relative simplicity of the architecture.

For example, digital to analog converter 222 with 15 individual current-steering cells wherein each cell is controlled by one bit of thermometer-encoded digital input of a thermometer code of logic signals 228, and two additional constant-current cells, of half-size, fixed current cells 308 and 310, forming together effectively a 16th cell, is sufficient to realize a 64-state phase rotator, which is one of the most typical phase rotator types. More specifically, polarity switches 240 and 242 with control signals SI 224 and SQ 226 of FIG. 2 select one of the four possible quadrants on an I/Q phase diagram, while the 15-bit thermometer code of logic signals 228 controlling the current-steering switches S1 302, S2 304 through SM 306 of individual digital to analog cells selects 16 different rotator states within a single quadrant. Polarity switches 240, 242 of FIG. 2 then control quadrant transitions while the thermometer code 228 controls the phase rotator state within a quadrant. Fixed current cells 308 and 310 apply a constant low current equal to one half current unit of a regular current-steering cell to both digital to analog converter outputs when switching polarity to avoid having no current supplied to an output OUT_P 312, and OUT_N 314. Therefore, in phase rotator 200 shown in FIG. 2 at the quadrant boundary the polarity switch would change the effective weight of a respective clock phase from +½ to −½ units and therefore would achieve a regular 1-unit phase step.

Figure 4:
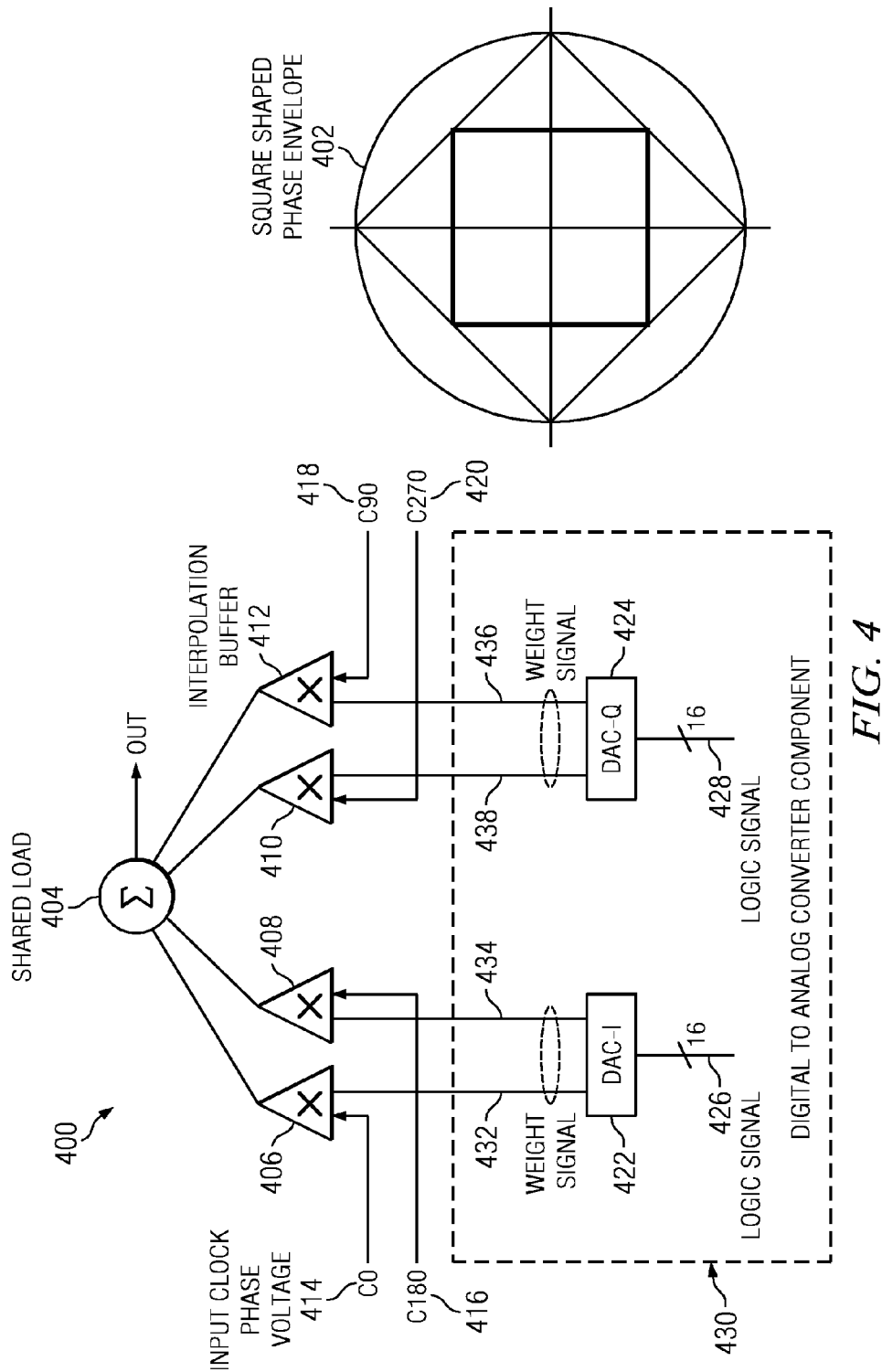
FIG. 4 is a block diagram of a 64-state phase rotator using dual digital to analog converters.

With reference to FIG. 4, a block diagram of a 64-state phase rotator using dual digital to analog converters is presented. In this design of dual-digital to analog converter phase rotator 400, current is steered independently between two different polarities of an I clock phase (at 0 and 180 degrees) and two different polarities of a Q clock phase (at 90 and 270 degrees) by using two identical current-steering digital to analog converters 422 and 424, denoted as digital to analog converter-I (DAC-I) and digital to analog converter-Q (DAC-Q). The clock phase arrives as a set of input clock phase voltage signals 414, 416, 418 and 420. Digital to analog converters 422 and 424 use the same basic structure as digital to analog converter 222 of FIG. 2, however the digital to analog converters in this case do not need half-sized fixed cells, and instead each use one additional current-steering cell. Digital to analog converters 422 and 424 create as output, weight signals 432, 434, 436 and 438, that are applied to the respective interpolation buffers.

For a 64-state phase rotator, each digital to analog converter 422 and 424 needs 16 current steering cells that are controlled by logic signals 426 and 428 each being a form of a 16-bit thermometer code. Digital to analog converters 422 and 424 with associated logic signals 426 and 428 comprise digital to analog converter component 430.

The top portion of dual-digital to analog converter phase rotator 400 comprises a four-quadrant mixer consisting of four individual interpolating buffers 406, 408, 410 and 412, with a shared load 404. The interpolating buffers receive their respective weighting currents as weight signals 432, 434, 436, and 438 from dual-digital to analog converters 422, and 424. There are no extra polarity switches in digital to analog converter component 430. Shared load 404 may be implemented as a set of resistors, wherein the set comprises one or more resistors.

Complete separation of currents used to power two I-phases and two Q-phases means that the maximum weight applied to any given clock phase cannot exceed 50 percent of the total, since each of digital to analog converters 422 and 424 controls 50 percent of the total weight. For example, assuming thermometer code control limiting a single bit at a time change, dual digital to analog converter phase rotator 400 is controlled using the following rule: only one of digital to analog converters 422 and 424 can be steering current/weight at a given time. The remaining digital to analog converter should stay in a fully-saturated position, wherein the digital to analog converter assigns zero weight to one of its outputs and the maximum (i.e. 50 percent of the total) to the other.

As a consequence, only one of the two coordinates (I or Q) on a phase diagram can be changing at any given time, while the other coordinate should stay constant at either +50 percent or −50 percent. Therefore, the phase envelope is a square inscribed into the diamond phase envelope of a single-digital to analog converter rotator, as shown as square-shaped phase envelope 402. When dual-digital to analog converter phase rotator 400 is constantly stepping in one direction, the effective weights applied to I and Q phases are trapezoidal waves with equal ratio of slewing and constant (flat) portions, which reflects the fact that only one of these two waveforms can be changing at one time.

Drawbacks of a dual-digital to analog converter phase rotator 400 are a doubling of complexity, as compared to a single-digital to analog converter case, resulting from increasing from 16 to 32 total digital to analog converter cells in a 64-state rotator and an increased interpolation loss. For example, the minimum output amplitude in dual-digital to analog converter phase rotator 400 is 50 percent (6 dB loss). The loss occurs near phase positions at 0, 90, 180, and 270 degrees, where 50 percent of the current is applied to the main phase, while 25 percent is applied to each of the two nearest quadrature phases that have opposite polarities. The latter two currents completely cancel each other, thus consuming 50 percent of the current without contributing anything to the output amplitude, causing the amplitude to remain at 50 percent. The maximum amplitude is therefore achieved at phase positions at 45, 135, 225, and 315 degrees, when only two quadrature phases out of four are active and each receives 50 percent of the total current/weight resulting in amplitude of $1/\sqrt{2}=70.7$ percent, or 3 dB more than a minimum amplitude. Therefore, dual-digital to analog converter architecture as used in the example of dual-digital to analog converter phase rotator 400 has an interpolation loss of 6 dB, an amplitude modulation of 3 dB, and requires 32 digital to analog converter cells to realize a 64-state phase rotator.

While digital to analog converter component 430 of dual-digital to analog converter phase rotator 400 has double the complexity of a single-digital to analog converter phase rotator and its interpolator has lower efficiency, digital to analog converter component 430 does offer improved interpolation linearity. Digital to analog converter component 430 avoids assigning a near-zero weight to the clock phases in the interpolation product (I or Q) and instead, achieves effective zero weight by assigning equal non-zero weights to two clock phases of opposite polarity.

For example, effective zero weight of phase Q near 0-degree phase state is achieved by assigning weights of 25 percent to each of the phases Q and −Q, while phase I receives 50 percent, and therefore the max/min ratio of the biasing level of their respective interpolation buffers is only 2, while in the single-digital to analog converter architecture shown in FIG. 2, the same max/min weight ratio exceeds 30 as calculated from 15.5 units of current on high-bias side and 0.5 units of current on low-bias side. This relative stability of biasing conditions dramatically reduces nonlinearities from bandwidth and delay modulation of interpolation buffers 406, 408, 410 and 412 compared to the biasing conditions of the respective interpolation buffers 206, 208, 210, and 212 in the single-digital to analog converter phase rotator 200 of FIG. 2.

Figure 5:
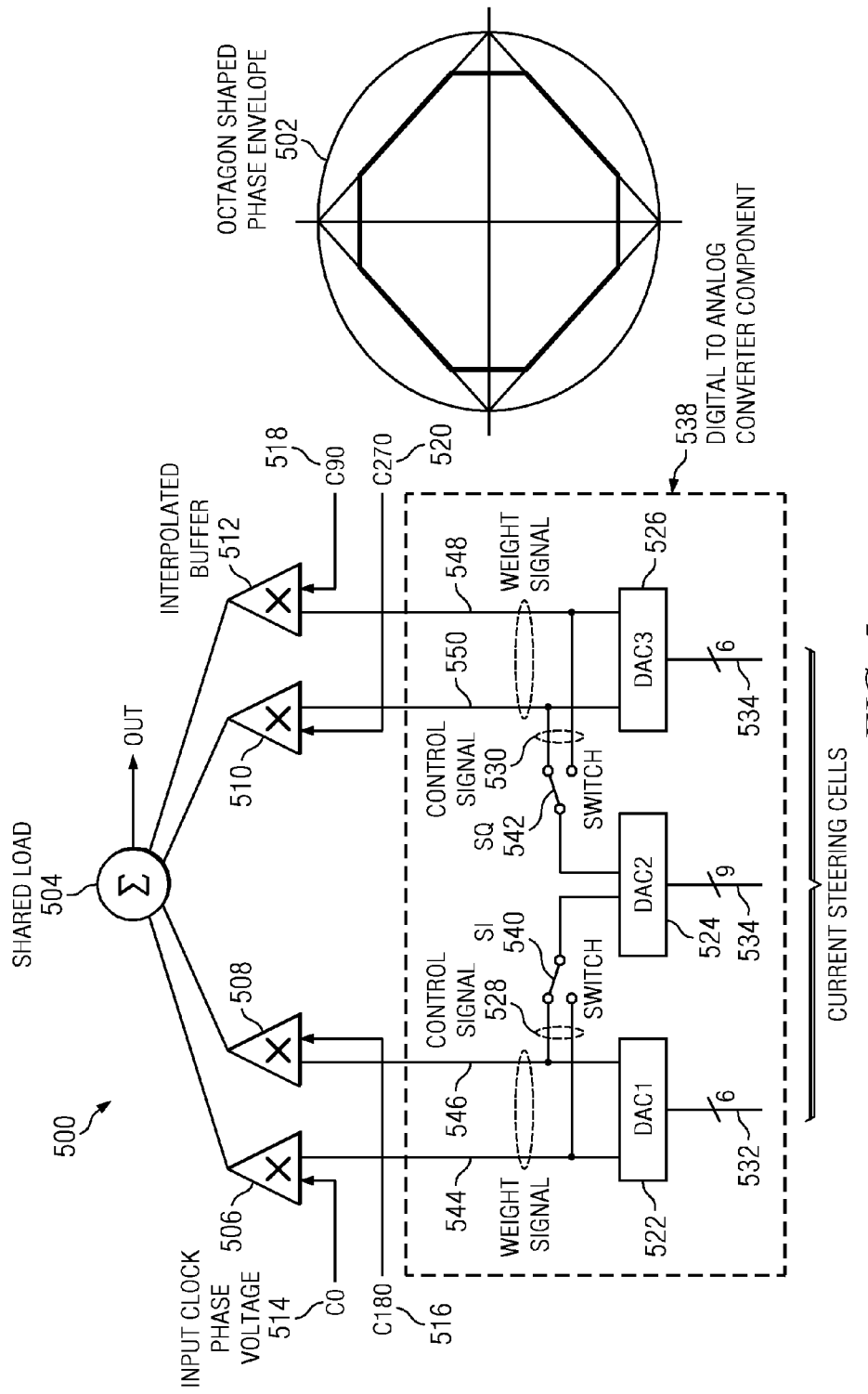
FIG. 5 is a block diagram of a 64-state current-mode phase rotator using a composite digital to analog converter incorporating multiple digital to analog converters, in accordance with illustrative embodiments.

With reference to FIG. 5, a block diagram of a 64-state phase rotator using a composite digital to analog converter incorporating multiple digital to analog converters in accordance with illustrative embodiments is presented. Phase rotator with multiple digital to analog converters 500 includes a switched digital to analog converter in combination with dual-digital to analog converters within digital to analog converter component 538.

By comparing the two phase rotator architectures of the previous examples of FIG. 2 and FIG. 4, one can observe that a single digital to analog converter architecture achieves its minimum loss and maximum nonlinearity near phase positions at 0, 90, 180, and 270 degrees, while the dual-digital to analog converter architecture experiences its maximum loss at the same positions while having high linearity. On the other hand, at phase positions at 45, 135, 225, and 315 degrees, the two architectures have nearly identical loss and a similar high level of linearity.

Phase rotator with multiple digital to analog converters 500 is an example of an embodiment in which excess amplitude of the single-digital to analog converter phase rotator 200 of FIG. 2 at phase positions at 0, 90, 180, and 270 degrees is traded for improved linearity, similar to that of the dual digital to analog converter phase rotator 400 of FIG. 4. The trade-off is conditioned up to a point where the amplitude is reduced by 3 dB, thereby not affecting maximum loss while reducing the amplitude modulation. Phase rotator with multiple digital to analog converters 500 is an exemplary embodiment using a three-digital to analog converter or "partially-switched" architecture wherein one digital to analog converter 524 has polarity switches and two other digital to analog converters 522 and 526 have no switches, as shown in FIG. 5.

A top section of phase rotator with multiple digital to analog converters 500 comprises four interpolation buffers 506, 508, 510 and 512 with a common summing load of shared load 504 that receive respective input clock phase voltages 514, 516, 518 and 520. The structure of digital to analog converter component 538 differs from previous phase rotators shown in that the structure now contains three digital to analog converters. The difference is not simply in the number of digital to analog converters but that each of these digital to analog converters has less complexity in terms of number of digital to analog converter current steering cells than a corresponding counterpart previously shown in FIG. 2 and FIG. 4. Shared load 504 may be implemented as a set of resistors, wherein the set comprises one or more resistors.

For example, assuming a thermometer code control limiting a single bit at a time change, digital to analog converter component 538 allows only one out of three digital to analog converters to change state when the phase rotator makes a single least significant bit (LSB) step during rotation. An additional constraint is also applied in which only one of the digital to analog converters 522 and 526 can be in a non-saturated state. Saturation means steering the maximum possible current to one of the two outputs within a two-output current steering digital to analog converter. All the steps performed with non-switching digital to analog converters 522 and 526 will be either vertical or horizontal vectors on I/Q phase diagram, while all steps performed with switched digital to analog converter 524 will be diagonal 45-degree vectors.

Switching digital to analog converter 524 incorporates polarity switches 540 and 542 having control signals SI 528 and SQ 530. Switching digital to analog converter 524 includes current steering cells and receives input from logic control signals 534, while non-switching digital to analog converter 522 includes current steering cells and receives input from logic control 532, and non-switching digital to analog converter 526 includes current steering cells and receives input from logic control 536.

Composite digital to analog converter component 538 comprised of three individual digital to analog converters 522, 524, and 526 and of polarity switches SI 540 and SQ 542 produces four weight currents 544, 546, 548, and 550 that are applied to respective interpolation buffers 506, 508, 510, and 512 as interpolation weights.

By stepping the different digital to analog converters within composite digital to analog converter component 538 in a predefined sequence, octagonal phase envelope 502 is inscribed into the diamond-shaped envelope associated with a single-digital to analog converter rotator. The result is the same low interpolation loss of 3 dB, with a substantially reduced amplitude modulation of octagonal phase envelope 502. The reduced amplitude modulation is achieved by decreasing the maximum amplitude achieved at the tips of the diamond by "clipping" the tips by an appropriate amount that does not exceed 3 dB and therefore, does not increase the maximum interpolation loss of 3 dB beyond that of the single-digital to analog converter architecture of FIG. 2.

The attenuation is achieved functionally by removing excess current from the dominant, highly-biased phase and splitting the current equally between the two polarities of the low-biased quadrature phase. Such redistribution of removed current eliminates operation of the interpolation buffers at very low bias condition and therefore, avoids associated non-linearities arising from excessive modulation of bandwidth and delay in under-biased buffers. High linearity mode of operation of a dual digital to analog converter architecture is therefore achieved without associated loss increases. Additionally, a reduction in amplitude modulation is also attained in comparison with previous architecture implementations, typically to below 1 dB instead of 3 dB of the prior architectures.

Further, improvements did not bring a substantial increase in phase rotator complexity since phase rotator with multiple digital to analog converters 500 is only marginally more complex than a simpler single-digital to analog converter phase rotator, and is less complex than a dual-digital to analog converter phase rotator. Complexity, in this case, refers to the required number of cells within each digital to analog converter. Actual relative complexity can vary since the architecture embodied in phase rotator with multiple digital to analog converters 500 allows choosing an optimum amount of "clipping" of the vertices of the diamond shape.

For example, a 64-state rotator, as in FIG. 5, is achieved with a 10-cell polarity-switching digital to analog converter 524 in which there are 9 current-steering cells and one effective fixed cell, and 6 cells in each of dual digital to analog converter 522 and 526 for a total of 22 cells. In this example, there are 6 cells more than in a single-digital to analog converter implementation such as in FIG. 2, and 10 cells less than in a dual-digital to analog converter implementation as described in FIG. 4.

In the example, a 64-state rotator has k current-steering cells in at least one digital to analog converter and has 15-k current-steering cells in each of the remaining digital to analog converters for a total of 30-k current-steering cells in the full set of digital to analog converters. The at least one digital to analog converter has an extra $(k+1)^{th}$ cell permanently split into two equal parts, each part driving one half unit of current into one of two outputs of the at least one digital to analog converter. The extra cell allows the rotator to make a step when the extra switches of the at least one digital to analog converter change state, while no steerable digital to analog converter cells are switching, responsive only to a control bit flip.

Phase rotator with multiple digital to analog converters 500 is essentially a generic four-quadrant current-mode (CML) mixer driven by an advanced current-steering four-output composite digital to analog converter having one output per mixer quadrant. The composite digital to analog converter generally aims to approximate, in the most efficient way, an ideal set of four weighting currents that consists of four elevated sinusoids with uniformly spaced phases.

The design of phase rotator with multiple digital to analog converters 500 attempts a better approximation that typically yields increased benefit in comparison to other solutions and to implement the approximation with minimum hardware overhead. Phase rotator with multiple digital to analog converters 500 satisfies at once two conditions. First, to maintain low interpolation loss of 3 dB or better, as in the diamond-envelope rotator 202 of FIG. 2. Second to avoid simultaneous assignment of a low mixing weight to both polarities of a given clock phase in the mixing product that distorts timing of that clock phase and creates phase rotator non-linearity, as in the square-envelope phase rotator 402 of FIG. 4.

Phase rotator with multiple digital to analog converters 500 comprises a composite four-output digital to analog converter component 538 consisting of direct current sources and current-steering switches where there are two distinct types of direct current sources. Sources of one type can be steered to any of the four outputs, such as those inside the IQ digital to analog converter 524 including two extra switches, and sources of the second type can be steered only between a specific two outputs out of four, such as those inside I digital to analog converter 522 and Q digital to analog converter 526.

Phase rotator with multiple digital to analog converters 500 thus provides a capability for a mixer comprising a set of four interpolation buffers 506, 508, 510 and 512 sharing a common load 504 wherein each interpolation buffer receives as input a clock phase from a set of equidistant clock phases 514, 516, 518 and 520 and a weight signal 544, 546, 548, and 550, from a set of digital to analog converters 522, 524 and 526 of a composite four-output digital to analog converter component 538. Each digital to analog converter generates two output currents providing a weight signal having a constant sum, wherein at least one digital to analog converter is connected to the set of interpolation buffers through a set of switches SI 540 and SQ 542 providing output to all of the set of interpolation buffers and remaining digital to analog converters are connected directly to the interpolation buffers. Each of the remaining digital to analog converters can supply output to only two of the set of interpolation buffers, and a control code of control signals 528 and 530 that controls individual switches of the composite four-output digital to analog converter to allow only one bit of the control code to change at one time.

Figure 6:
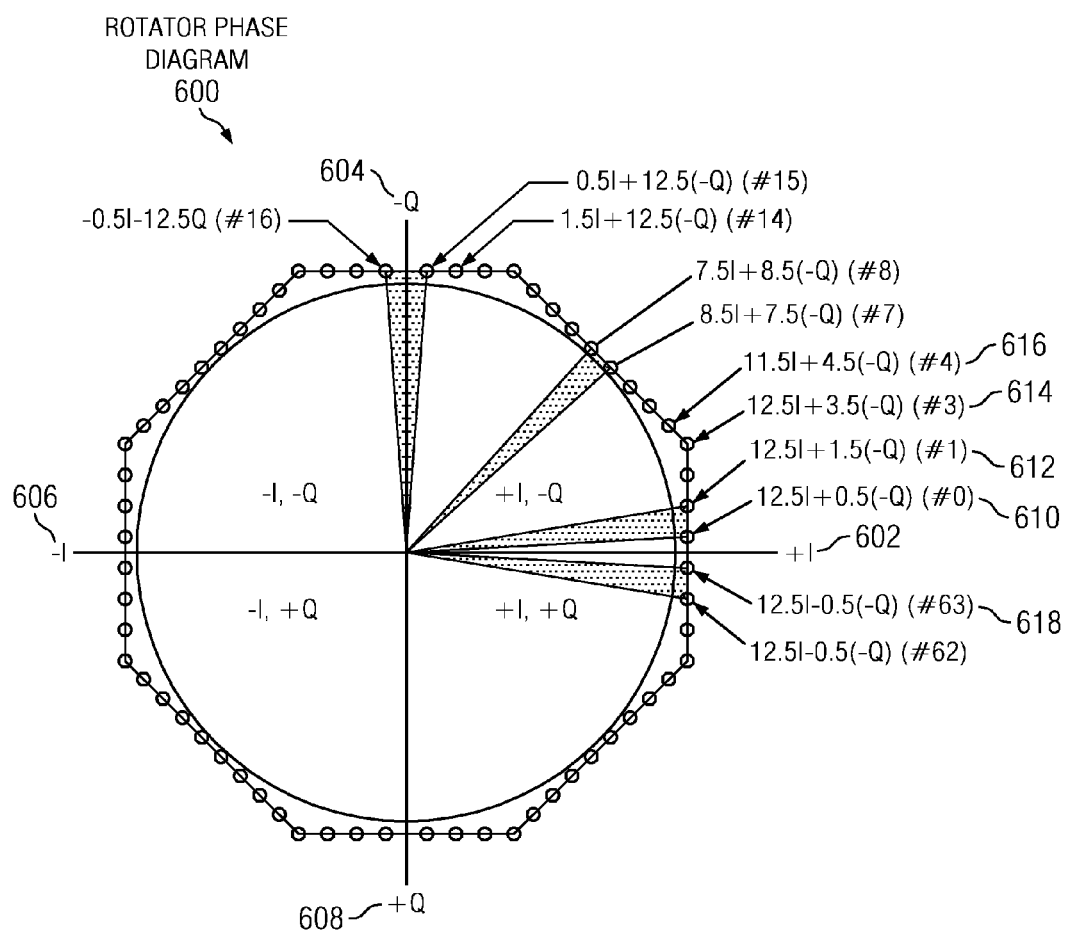
FIG. 6 is a block diagram of phase positions and quadrant transitions of the 64-state phase rotator of FIG. 5, in accordance with illustrative embodiments.

With reference to FIG. 6, a block diagram of phase positions and quadrant transitions of the 64-state phase rotator of FIG. 5 is presented in accordance with illustrative embodiments. Rotator phase diagram 600 is an example of a phase diagram realized through implementation of multiple digital to analog converters phase rotator 500 of FIG. 5.

In one example, the operation and control of phase rotator with multiple digital to analog converters 500 with a 22-cell set of digital to analog converters is described. Phase rotator with multiple digital to analog converters 500 creates a constellation of 64 phase states on a phase plane that has an octagonal envelope as in octagonal envelope 502 of FIG. 5, via mixing of four quadrature phases, phase +I 602, phase −I 606, phase −Q 604 and phase +Q 608, also referred to as clock phases C0, C180, C90, and C270 respectively. The mixing is done using a four-quadrant current-mode mixer with four tail currents. The four tail currents are generated by three current-steering digital to analog converters. The three current-steering digital to analog converters comprise, a 6-section I-digital to analog converter 532, a 6-section Q-digital to analog converter 536 and a 9-section IQ-digital to analog converter 534 with 2-bit polarity control implemented using polarity switches SI 540 and SQ 542, all of FIG. 5.

In the example of FIG. 2, single digital to analog converter phase rotator 200 produced a diamond-shaped phase envelope and achieved 64 phase states using a single 15-cell IQ digital to analog converter with 2-bit polarity control. In the example of phase rotator with multiple digital to analog converters 500 of FIG. 5, the phase rotator acts to clip the vertices of the diamond shape, as previously seen in diamond shaped phase envelope 202 of FIG. 2, to improve rotator linearity and achieve more stable amplitude. Octagon shaped phase envelope 502 of FIG. 5 is closer to an ideal phase circle than the previously obtained diamond shape.

In phase rotator with multiple digital to analog converters 500, of FIG. 5, the first two digital to analog converters 522 and 526 of FIG. 5, are identical and steer current between positive and negative polarities of their respective clock phases (+I and −I or +Q and −Q). For the purpose of state labeling, it is convenient to assume that each section of digital to analog converter 522 and digital to analog converter 526 carries 0.5 units of current. Therefore, 6 sections produce 7 possible output combinations ranging from +3 to −0 meaning all 6*0.5 units of current supplied to the positive phase and none to the negative phase, followed by (+2.5−0.5) meaning 5*0.5 units to the positive phase, 1*0.5 units to the negative phase, and so on until the last combination of (+0−3), i.e. all 6*0.5 units applied to the negative phase.

The IQ-digital to analog converter of digital to analog converter 524 of FIG. 5, differs from digital to analog converter 522 of FIG. 5, and digital to analog converter 526 of FIG. 5, because it has 4 outputs to steer the current between all 4 clock phases +I, −I, +Q and Q. However, only two of the outputs of digital to analog converter 524 of FIG. 5, receive any current at any given time. A determination as to which output is active is made using two polarity bits POL_0 and POL_1 controlling polarities of I phase and Q phase respectively. In the example, IQ-digital to analog converter has 9 sections, each bearing a weight of 1 current unit, and steers the associated output current between two internal nodes, I and Q. The internal nodes are then connected to the respective positive or negative clock phases via polarity switches 540 and 542 driven by control signals 528 and 530 of FIG. 5, respectively for a total of 4 current outputs. IQ digital to analog converter also has an extra 10th section that is not switched, but it is constantly split 50/50 between the two internal nodes I and Q, and delivers 0.5 units of current to each of them. Therefore, IQ-digital to analog converter delivers to the internal nodes ten different current combinations (9.5I/ 0.5Q), (8.5I/1.5Q) . . . (0.5I, 9.5Q). Taking into account action of two polarity switches 540 and 542 using control signals 528 and 530 that can flip the effective polarity of each of the two currents (I, Q) via routing them to either positive or negative clock phases, the total number of output states of the IQ-digital to analog converter, digital to analog converter 524 is 2*2*10=40.

The rotator states are uniformly distributed around a 360 degree phase circle with a nominal separation of one least significant bit (LSB), wherein one least significant bit=360/ 64=5.625 degrees, and an offset of one half least significant bit in respect to zero phase position, for example a clock phase I. Positive rotation direction corresponds to progressively decrementing the phase rotator output phase, thereby progressively decreasing the phase rotator delay and creating associated finite positive frequency offset.

Rotator state #0 610, is defined by assigning maximum positive weight (+12.5 units, +3 units from I-digital to analog converter 522 and 9.5 units from IQ-digital to analog converter 524) to clock phase I (phase C0) and minimum positive weight (+0.5 units, 0 units from Q-digital to analog converter 526, as (1.5-1.5)Q and 0.5 units from IQ-digital to analog converter 524) to phase (−Q) (C270), so state #0 610 is labeled as +12.5I+0.5(−Q). Clock phase (−Q) is used instead of Q to satisfy the conventional definition of positive rotator direction as that of reducing delay, since phase Q is 90 degrees early in respect to +I and +Q is 90 degrees late.

State #1 612 is obtained by adding 1 unit of digital to analog converter current to phase (−Q) by steering Q-digital to analog converter 526 by one step, from 0=(3*0.5−3*0.5) to 1=(4*0.5−2*0.5), while keeping the weight of I phase unchanged at +12.5I, and is labeled as +12.5I+1.5(−Q). Upon reaching state #3 614, 12.5I+3.5(−Q), steering of Q-digital to analog converter 526 completes and IQ-digital to analog converter 524 starts to steer, resulting in simultaneous reduction of weight of I phase and equal increase of weight of phase (−Q), so state #4 616 is 11.5I+4.5(−Q). A step from state #0 610 in the opposite direction (i.e. to state #63 618) is achieved by flipping the polarity of weight applied to phase (−Q) by changing the Q-polarity of IQ-digital to analog converter 524 from 0.5 to −0.5, so state #63 618 is labeled +12.5I−0.5(−Q). Note that only one bit is switched at every rotator step, in this case it is a polarity bit, so all digital to analog converter data bits stay constant.

With reference to FIG. 7A and FIG. 7B, a tabular representation of values of phase rotator digital to analog converter states, using the phase rotator with multiple digital to analog converters of FIG. 5, in accordance with illustrative embodiments is presented. Table 700 is an example table of values representing the values used when stepping through the 64 states of the phase rotator around the octagonal shaped phase envelope.

In the example, header row 702 provides labels for the various columns of table 700. State 704 indicates the phase rotator state. Mixer weights 706 indicates the ratio of weights applied in the specific state to the summing component of the mixer, such as shared load 504 in the mixer, phase rotator with multiple digital to analog converters 500 of FIG. 5. IQ-DAC 708 indicates the column of values for the switching digital to analog converter. I-DAC 710 and Q-DAC 712 represent values for each respective un-switched digital to analog converter.

Rows of the following 64-line table describes 64 possible rotator states numbered from 0 to 63 and the corresponding values of a 23-bit rotator input vector composed of two polarity bits (XXXPOL_1, XXXPOL_0) controlling a polarity of Q and I input clock phases respectively in an IQ-digital to analog converter, and 21 thermometer code bits (ROTXXX<20:0>). The 21 thermometer code bits consist of 3 fields, <20:15>, <14:9>, and <8:0> that provide thermometer bits to Q-digital to analog converter (6 bits), I-digital to analog converter (6 bits), and IQ-digital to analog converter (9 bits) respectively. I and Q digital to analog converters receiving all zero thermometer bits steer all output current (6*0.5 units) to their respective positive output, while IQ-digital to analog converter steers all of its current (9.5 units) to its internal node I (except 0.5 units to node Q). In the case of "all ones" the I and Q digital to analog converters steer the same current to the negative outputs (−I, −Q), while IQ-digital to analog converter steers 9.5 units to internal node Q and 0.5 units to internal node I. For polarity switches in IQ-digital to analog converter, positive polarity is encoded as logic 0 and negative polarity as logic 1.

Row 714 indicates phase state 0, in which maximum weight is applied to quadrant I comprising +9.5I from IQ-DAC and +3.0 from I-DAC and one half weight unit to quadrant −Q. Row 716 indicates phase state 1, in which maximum weight is applied to quadrant I comprising +9.5I from IQ-DAC and +3.0 from I-DAC and one and a half weight units to quadrant −Q. Row 718 indicates phase state 3, in which maximum weight is applied to quadrant I comprising +9.5I from IQ-DAC and +3.0 from I-DAC and three and one half units to quadrant −Q. Row 720 indicates phase state 4, in which eleven and one half weight units are applied to quadrant I comprising +8.5I from IQ-DAC and +3.0 from I-DAC and four and one half weight units to quadrant −Q. Row 722 indicates phase state 63, in which the phase rotator has come full circle and maximum weight is applied to quadrant I comprising +9.5I from IQ-DAC and +3.0 from I-DAC and one half unit to quadrant +Q.

An apparatus for a current-mode phase rotator has thus been described in illustrative embodiments. In one illustrative embodiment, the apparatus provides a capability of a mixer comprising a set of four interpolation buffers sharing a common load wherein each interpolation buffer receives as input a clock phase from a set of equidistant clock phases and a weight signal, a set of digital to analog converters in a composite four-output digital to analog converter each generating two output currents providing the weight signals having a constant sum, wherein at least one digital to analog converter is connected to the set of interpolation buffers through a set of switches providing output to all of the set of interpolation buffers and remaining digital to analog converters are connected directly to the interpolation buffers, wherein each of the remaining digital to analog converters can supply output to only two of the set of interpolation buffers, and a control code that controls individual switches of the composite four-output digital to analog converter to allow only one bit of the control code to switch at one time when changing between adjacent states.

The block diagrams in the figures illustrate the architecture, functionality, and operation of possible implementations of systems according to various embodiments of the present invention. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, the practical application, and to enable others of ordinary skill in the art to understand the invention for various embodiments, with various modifications as are suited to the particular use contemplated.

The invention can take the form of an entirely hardware embodiment, or an embodiment containing both hardware and software elements. In a preferred embodiment, the invention is implemented in hardware, which includes but is not limited to firmware, resident software, microcode, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments, with various modifications as are suited to the particular use contemplated.

What is claimed is:

1. An apparatus for current-mode phase rotation, the apparatus comprising:
    a mixer comprising a set of four interpolation buffers sharing a common load wherein each interpolation buffer receives as input a clock phase from a set of equidistant clock phases and a weight signal; and
    a set of digital to analog converters, in a composite four-output digital to analog converter, each generating two output currents providing the weight signals having a constant sum, wherein at least one digital to analog converter is connected to the set of interpolation buffers through a set of switches providing output to all of the set of interpolation buffers and remaining digital to analog converters are connected directly to the interpolation buffers, wherein each of the remaining digital to analog converters can supply output to only two of the set of interpolation buffers.

2. The apparatus of claim 1 wherein only one of the two remaining digital to analog converters can assume a non-saturated state in which individual current-steering cells steer current to two different outputs.

3. The apparatus of claim 1 further comprising a control code that controls individual switches of the composite four-output digital to analog converter, wherein the control code allows only one bit to switch at a time when changing between adjacent states, and each bit changes no more than once per quadrant.

4. The apparatus of claim 3 wherein the control code adjusts output of the set of digital to analog converters to steer currents between two interpolation buffers processing adjacent clock phases for a "diagonal" portion of the phase envelope and between the opposite phases of opposite polarity for vertical and horizontal portions of the phase envelope.

5. The apparatus of claim 3 wherein a 64-state rotator has k current-steering cells in the at least one digital to analog converter and has 15-k current-steering cells in each of the remaining digital to analog converters for a total of 30-k current-steering cells in the set of digital to analog converters.

6. The apparatus of claim 3 wherein the at least one digital to analog converter has an extra $(k+1)^{th}$ cell permanently split into two equal parts, each part driving one half unit of current into one of two outputs of the at least one digital to analog converter, wherein the extra cell allows the rotator to make a step when the set of switches of the at least one digital to analog converter change state, while no steerable digital to analog converter cells are switching.

7. The apparatus of claim 3 wherein one output of the first digital to analog converter supplies current to one of phase 0 or phase 180, while another output supplies current to one of phase 90 or phase 270, and one remaining digital to analog converter has two outputs supplying current only between phases 0 and 180, while another remaining digital to analog converter supplies current only to phases 90 and 270.

8. The apparatus of claim 1 wherein the at least one digital to analog converter further comprises a set of cells of two types, wherein a first type includes regular current-steering cells comprised of a current source of direct current and a current-steering switch that connects the current source to one of two outputs, and a second type of a special fixed non-switched cell that consists of two equal current sources of half-size that are permanently attached to two outputs, wherein each of the two outputs is subsequently routed to one of two mixer tail current inputs belonging to clock phases of opposite polarity, wherein the set of switches is referred to as polarity switches.

9. The apparatus of claim 1 wherein the set of switches of the at least one digital to analog converter are polarity switches that change their state on a crossing of a quadrant boundary.

10. An apparatus for a current-mode phase rotator with partial input phase switching, the apparatus comprising:
    a mixer, wherein the mixer is a four quadrant current-mode mixer comprised of four interpolation buffers, wherein each interpolation buffer receives as input a clock phase from a set of four equidistant clock phases; and
    a set of current-steering digital to analog converters that supply tail currents to the mixer wherein a first digital to analog converter has additional switches to connect each of two outputs to one of two polarities of a given clock while each remaining digital to analog converter has no additional switches and has two outputs supplying current only to two different polarities of a same clock phase wherein steering the current during incremental rotation about a phase circle defines an octagonal shaped phase envelope.

11. The apparatus of claim 10 wherein only one of the two remaining digital to analog converters can assume a non-saturated state in which individual current-steering cells steer current to two different outputs.

12. The apparatus of claim 10 wherein a control code driving the digital to analog converters causes the digital to analog converters to produce mixer tail currents that position phase states of a rotator output signal on an octagonal envelope.

13. The apparatus of claim 10 wherein one output of the first digital to analog converter supplies current to one of phase 0 or phase 180, while another output supplies current to one of phase 90 or phase 270, and one remaining digital to analog converter has two outputs supplying current only between phases 0 and 180, while another remaining digital to analog converter steers current only between phases 90 and 270.

14. The apparatus of claim 12 wherein the control code allows only one bit to switch at a time when changing between adjacent states, and each bit changes no more than once per quadrant.

15. The apparatus of claim 10 wherein the two remaining digital to analog converters each comprise a set of current-steering cells, wherein each current-steering cell is comprised of a current source of direct current and a current-steering switch that connects the current source to one of the two digital to analog converter outputs.

16. The apparatus of claim 10 wherein the first digital to analog converter with two additional current-steering switches further comprises a set of cells of two types, wherein a first type includes the regular current-steering cells comprised of a current source of direct current and a current-steering switch that connects the current source to one of the two digital to analog converter outputs, and a second type of a special fixed non-switched cell that consists of two equal current sources of half-size that are permanently attached to the two digital to analog converter outputs, wherein each of the two digital to analog converter outputs is subsequently routed to one of two mixer tail current inputs belonging to clock phases of opposite polarity, wherein the two additional current-steering switches are referred as polarity switches.

17. The apparatus of claim 10 wherein the additional switches of the first digital to analog converter are polarity switches that change their state on a crossing of a quadrant boundary.

18. A system comprising:
a system bus;
a memory controller/cache connected to the system bus;
a local memory;
a series communication link between the memory controller/cache and the local memory;
a processor connected to the system bus;
a mixer, within the series communication link, wherein the mixer is a four quadrant current-mode mixer comprised of four interpolation buffers, wherein each interpolation buffer receives as input a clock phase from a set of four equidistant clock phases; and
a set of current-steering digital to analog converters that supply tail currents to the mixer wherein a first digital to analog converter has additional switches to connect each of two outputs to one of two polarities of a given clock phase, wherein one output would supply current to one of phase 0 or phase 180, while another output would supply current to one of phase 90 or phase 270, while each remaining digital to analog converter has no additional switches and has two outputs supplying current only to two different polarities of a same clock phase, wherein one digital to analog converter steers current only between phases 0 and 180, while another digital to analog converter steers current only between phases 90 and 270, wherein steering current during incremental rotation about a phase circle defines an octagonal shaped phase envelope.

19. The system of claim 18, wherein a control code driving the digital to analog converters causes the digital to analog converters to produce mixer tail currents that position phase states of a phase rotator output signal on the octagonal shaped phase envelope.

20. The system of claim 18 wherein the additional switches of the first digital to analog converter are polarity switches that change state on crossing a quadrant boundary.

21. An apparatus for phase shifting, the apparatus comprising;
a phase selector for selecting two or more phases to create selected phases;
a phase interpolator capable of receiving the selected phases;
a set of digital to analog converter cells connected to the phase interpolator, wherein interpolator weight distribution among the set of digital to analog converter cells is non-linear and asymmetric; and
a thermometer code in communication with the set of digital to analog converter cells, wherein the thermometer code adjusts output of the set of digital to analog converter cells to phase shift the selected phases, wherein the thermometer code is rotating thermometer code that provides a substantially fifty percent duty cycle of all bits of the thermometer code when the phase rotator continuously steps in one direction.

22. The apparatus for phase shifting of claim 21, wherein the set of digital to analog converter cells comprises:
multiple sets of digital to analog converter cells.

23. The apparatus for phase shifting of claim 21, wherein each cell within a set is sequentially numbered and mapped one for one within a range to steps of the phase interpolator, a first cell forming a first step and a last cell forming step within the range.

24. The apparatus for phase shifting of claim 21, wherein the set of digital to analog converter cells further comprises a fixed cell providing a half unit of weight to each of the selected phases, wherein the fixed cell always applies a non-zero weight to the selected phases.

25. The apparatus for phase shifting of claim 23, wherein the phase selector traverses a boundary between ranges by switching a selected phase going into input of the phase interpolator that receives a minimum weight, forming a boundary step and the boundary separating preceded by switching the last cell of digital to analog converter cells and followed by switching the first cell of digital to analog converter cells.

26. The apparatus for phase shifting of claim 21, wherein the selected phases are processed by a slew buffer.

27. The apparatus for phase shifting of claim 21, wherein the phase interpolator further comprising rotator states uniformly distributed about a circle to create an equal angle of separation of the rotator states forming a phase rotator having unlimited phase range.

28. The apparatus for phase shifting of claim 21, wherein the implementation uses current mode logic (CML).

* * * * *